(12) United States Patent
Boehm

(10) Patent No.: US 10,593,384 B2
(45) Date of Patent: *Mar. 17, 2020

(54) METHODS OF DETERMINING HOST CLOCK FREQUENCY FOR RUN TIME OPTIMIZATION OF MEMORY AND MEMORY DEVICES EMPLOYING THE SAME

(71) Applicant: Micron Technology, Inc., Boise, ID (US)

(72) Inventor: Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/174,782

(22) Filed: Oct. 30, 2018

(65) Prior Publication Data

US 2019/0066742 A1 Feb. 28, 2019

Related U.S. Application Data

(63) Continuation of application No. 15/666,375, filed on Aug. 1, 2017, now Pat. No. 10,204,667.

(51) Int. Cl.
| | |
|---|---|
| *G11C 7/06* | (2006.01) |
| *G11C 7/22* | (2006.01) |
| *G11C 11/4076* | (2006.01) |
| *G11C 7/10* | (2006.01) |

(52) U.S. Cl.
CPC ............ *G11C 7/222* (2013.01); *G11C 7/1045* (2013.01); *G11C 11/4076* (2013.01)

(58) Field of Classification Search
CPC ..................................................... G11C 7/222
USPC ........................................ 365/189.07, 233.11
See application file for complete search history.

(56) References Cited

U.S. PATENT DOCUMENTS

| | | | |
|---|---|---|---|
| 2003/0065966 | A1 | 4/2003 | Poisner |
| 2006/0017429 | A1* | 1/2006 | Kim ......................... G11C 7/22 324/76.61 |
| 2014/0215130 | A1 | 7/2014 | Chen et al. |
| 2017/0200498 | A1 | 7/2017 | Shallal et al. |

* cited by examiner

*Primary Examiner* — Huan Hoang
(74) *Attorney, Agent, or Firm* — Perkins Coie LLP

(57) ABSTRACT

A memory device is provided. The memory device includes one or more memories and a connector operably coupled to the one or more memories and configured to receive signals including a first reference clock signal from a connected host. The memory device further includes circuitry configured to determine a frequency of the first reference clock signal. The circuitry can be configured to generate a second reference clock signal and to compare the first and second reference clock signals to determine the frequency of the first reference clock signal. The memory devices can further include circuitry configured to adjust one or more operating characteristics of the memory device in response to the determined frequency of the first reference clock signal.

16 Claims, 4 Drawing Sheets

METHODS OF DETERMINING HOST CLOCK FREQUENCY FOR RUN TIME OPTIMIZATION OF MEMORY AND MEMORY DEVICES EMPLOYING THE SAME

CROSS-REFERENCE TO RELATED APPLICATIONS

This application is a continuation of U.S. application Ser. No. 15/666,375, filed Aug. 1, 2017, which is incorporated herein by reference in its entirety.

TECHNICAL FIELD

The present disclosure generally relates to memory devices, and more particularly relates to methods of determining host clock frequency for run time optimization of memory and memory devices employing the same.

BACKGROUND

Memory devices, whether volatile or non-volatile, may be designed to operate over a wide range of operating frequencies, typically indicated to the memory devices by a host clock signal. For example, a single DRAM module may be designed to operate at any one of a number of frequencies between 800 MHz and 4000 MHz. While it can be desirable to optimize a memory module to operate at particular frequency, optimizations for one operating frequency may cause performance degradations at other operating frequencies. Accordingly, it would be beneficial to provide a method for optimizing memory devices to operate at multiple different frequencies, and memory devices capable of such optimization.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory devices are not shown, or are not described in detail, to avoid obscuring other aspects of the technology. In general, it should be understood that various other devices, systems, and methods in addition to those specific embodiments disclosed herein may be within the scope of the present technology.

As discussed above, memory devices can be designed to operate at any one of a different number of host clock frequencies. To better optimize the performance at a particular host clock frequency, it is desirable for the memory device to be able to determine the host clock frequency at which it is operating. Accordingly, several embodiments of memory devices in accordance with the present technology can include circuitry configured to determine the frequency of a clock signal provided by a connected host.

Several embodiments of the present technology are directed to memory devices comprising one or more memories, and a connector operably coupled to the one or more memories and configured to receive signals from a connected host. The signals include a first reference clock signal. The memory devices further comprise circuitry configured to determine a frequency of the first reference clock signal. In some embodiments, the circuitry configured to determine a frequency of the first reference clock signal can include circuitry configured to generate a second reference clock signal and circuitry configured to compare the first and second reference clock signals to determine the frequency of the first reference clock signal. In some embodiments, the memory devices may further comprise circuitry configured to adjust one or more operating characteristics of the memory device in response to the determined frequency of the first reference clock signal.

Figure 1:
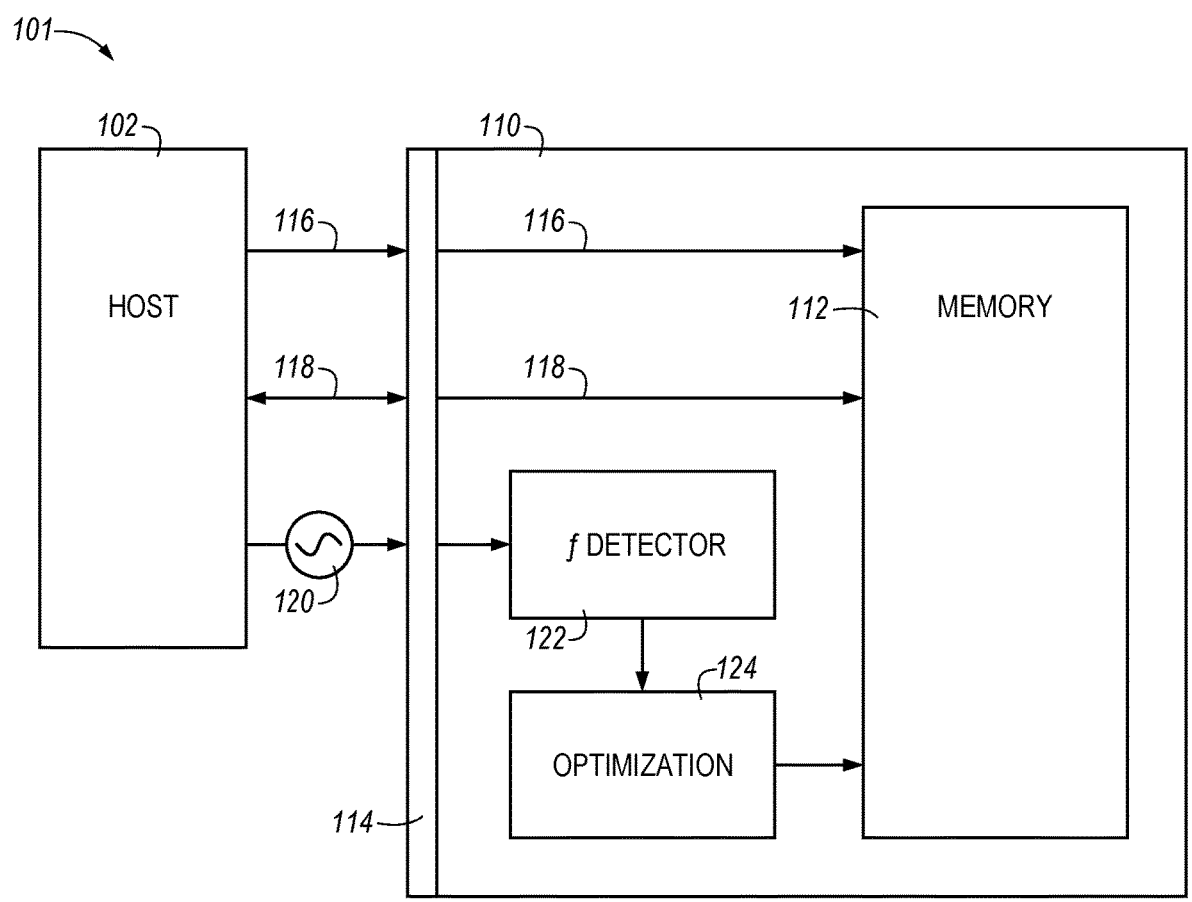
FIG. 1 schematically illustrates a system including a memory device configured to determine a host clock frequency in accordance with an embodiment of the present technology.

FIG. 1 schematically illustrates a system including a memory device in accordance with an embodiment of the present technology. The system 101 includes a host device 102 (e.g., a mobile phone, tablet, digital reader, digital media player, computer, appliance or the like) and a memory device 110 operably coupled to the host device 102. The memory device 110 includes one or more memories 112 (e.g., memory cell arrays, memory dies, memory packages or the like, including volatile memory such as DRAM, SRAM, ZRAM and the like, and/or non-volatile memory such as NAND, NOR, PCM, MRAM, 3DXP, FeRAM, ReRAM and the like) and a connector 114 (e.g., a module edge connector, a pin array, a ball array or the like) operably coupled to the one or more memories 112 and configured to receive signals from the connected host device 102. The signals can include command/address signals 116 and data signals 118, as well as a host clock signal 120.

The memory device 110 further includes frequency determination circuitry 122 configured to determine a frequency of the host clock signal 120. The frequency determination circuitry 122 can use any one of a number of methods to determine the frequency of the host clock signal 120, including, by way of example, comparing the host clock signal 120 to a locally generated clock signal of known frequency (e.g., by counting a number of cycles of the host clock signal 120 over a predetermined number of cycles of the locally generated clock signal of known frequency). The frequency determination circuitry 122 can be configured to store the determined frequency (e.g., in one or more registers, tables, pointers, etc.) for use by other circuitry. For example, the memory device 110 can further include optimization circuitry 124 configured to adjust one or more operating characteristics of the memory device 110 (e.g., path delays for DLLs, voltage, timing, etc.) in response to the determined frequency of the clock signal 120.

According to one embodiment of the present technology, the host clock signal 120 can change frequency during an operation of the memory device 110. Accordingly, the frequency determination circuit 122 can be configured to detect the new frequency and to provide information about the new frequency of the host clock signal 120 to the optimization circuitry 124. The frequency determination circuit 122 can be configured to store the new frequency, either by overwriting the previously stored frequency of the host clock signal 120 or, e.g., by adding an entry to a table tracking the changing frequency of the host clock signal 120. In accordance with one aspect of the present technology, the optimization circuitry 124 can be configured to utilize information about the changing frequency of the host clock signal 120 (e.g., information about multiple frequencies of the host clock signal 120) to adjust one or more operating characteristics of the memory device 110 (e.g., path delays for DLLs, voltage, timing, etc.) in response to the changing frequency of the clock signal 120.

Figure 2:
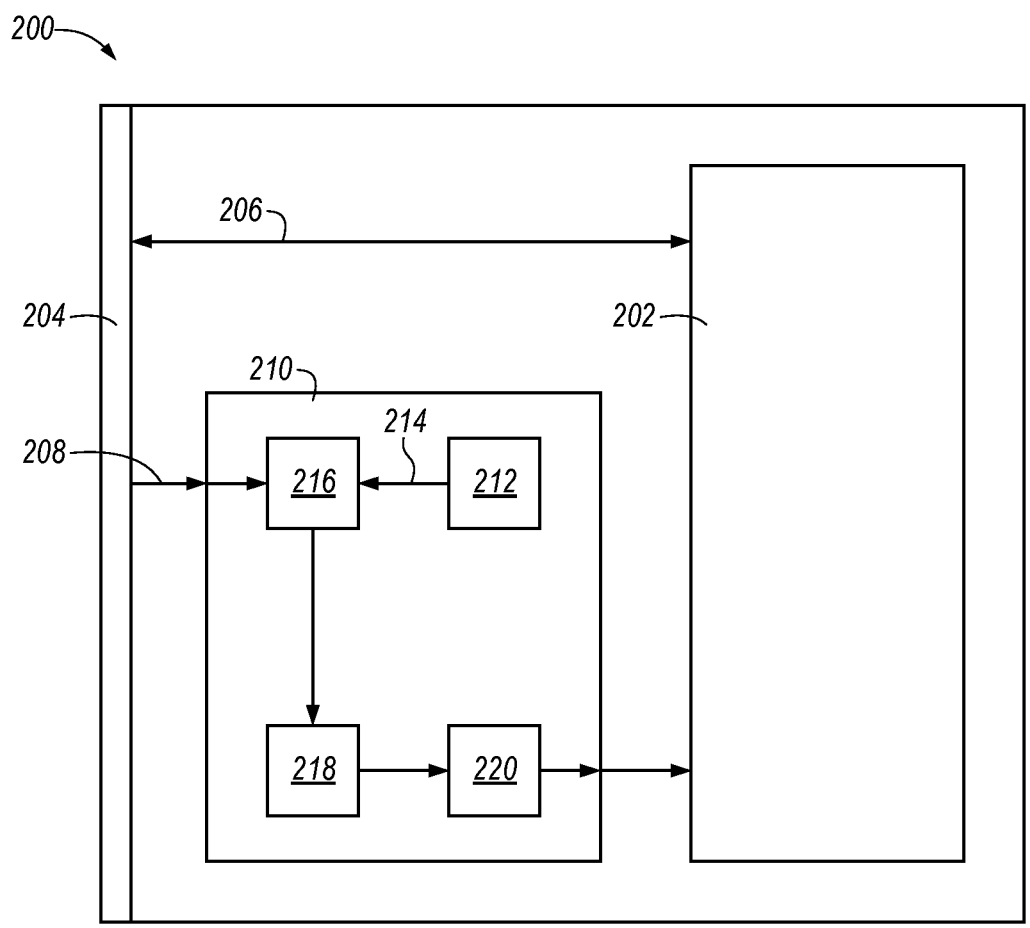
FIG. 2 schematically illustrates a memory module configured to detect a host clock frequency in accordance with an embodiment of the present technology.

FIG. 2 schematically illustrates a memory module in accordance with an embodiment of the present technology. Memory module 200 includes one or more memories 202 and a connector 204 operably coupled to the one or more memories 202 and configured to receive signals from a connected host device. The signals can include command/address and data signals 206, as well as a host clock signal 208 The memory module 200 further includes frequency determination circuitry 210 configured to determine a frequency of the clock signal 208.

The frequency determination circuitry 210 can include a local clock generator 212 (e.g., an oscillator, an RC circuit, a tank circuit, or the like) configured to generate a local clock signal 214 of a predetermined frequency. For example, the local clock generator 212 can be configured to generate a local clock signal 214 with a lower frequency than the range of frequencies at which the host clock signal 208 may be expected to operate. The frequency determination circuitry 210 can further include counting circuitry 216 configured to count a number of cycles of the host clock signal 208 over a predetermined number of cycles of the local clock signal 214, and calculation circuitry 218 to determine from the counted number of cycles a frequency of the host clock signal (e.g., in an embodiment where the local clock signal 214 is 100 MHz, and the host clock signal 208 is counted by the counting circuitry 216 to have 16 cycles over a single cycle of the local clock signal 214, the host clock signal 208 can be determined by the calculation circuitry 218 to be 1600 MHz).

The frequency determination circuitry 210 can further include storage circuitry 220 configured to store the frequency of the host clock signal 208 determined by the calculation circuitry 218, and to provide the stored frequency value to other circuitry of the memory device 200 that are configured to adjust their operating characteristics in response thereto. The storage circuitry 220 can include one or more registers, tables or the like for storing information about the frequency of the host clock signal 208 for later retrieval (e.g., by optimization circuitry in or coupled to the one or more memories 202).

Although in the foregoing embodiment, the local clock generator 212 has been described as generating a local clock signal 214 with a lower frequency than that of the host clock signal 208, in another embodiment, the local clock generator 212 can be configured to generate a local clock signal 214 with a higher frequency than the range of frequencies at which the host clock signal 208 may be expected to operate. In such an embodiment, the counting circuitry 216 can be configured to count a number of cycles of the local clock signal 214 over a predetermined number of cycles of the host clock signal 208, and the calculation circuitry 218 can be configured to determine from the counted number of cycles a frequency of the host clock signal.

In the embodiment illustrated in FIG. 2, the one or more memories 202 are illustrated as receiving information about the determined frequency of the host clock signal 208 directly from the storage circuitry 220. This may be the case when the one or memories 202 are configured to include optimization circuitry for optimizing frequency-dependent circuitry within the one or more memories (e.g., path delays for DLLs, voltage, timing, etc.). In other embodiments, the memory device 200 can include dedicated optimization circuitry separate from the one or more memories 202 to optimize the one or more memories 202 and/or other circuits of the memory device 200 (e.g., a registering clock driver, an onboard controller, etc.).

Figure 3:
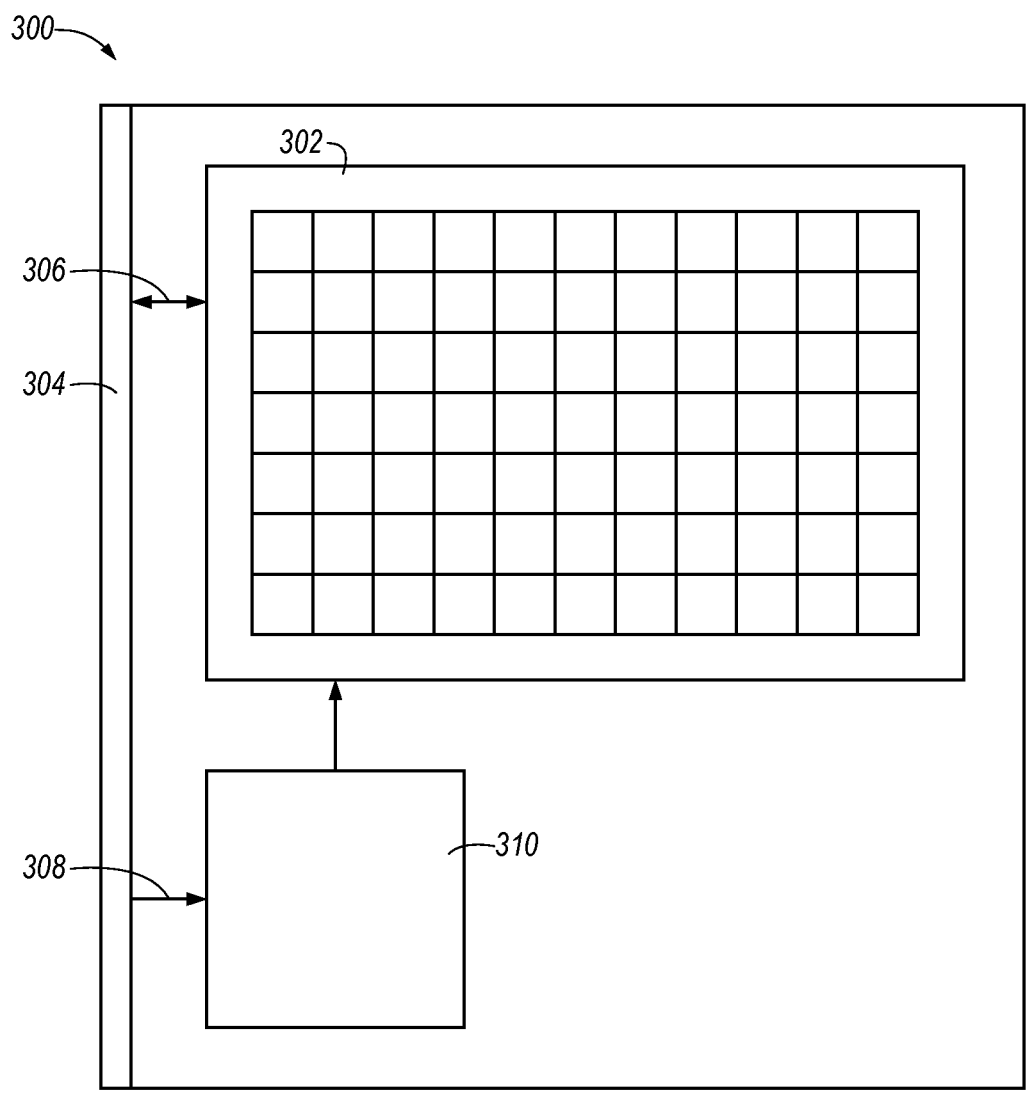
FIG. 3 schematically illustrates a memory device configured to detect a host clock frequency in accordance with an embodiment of the present technology.

FIG. 3 schematically illustrates a memory device (e.g., a memory die, a memory package, or the like) having embedded frequency determination circuitry in accordance with an embodiment of the present technology. Memory device 300 includes a memory array (e.g., one or more arrays of memory cells) and a connector 304 operably coupled to the memory array 302 and configured to receive signals from a connected host device. The signals can include command/address and data signals 306, as well as a host clock signal 308 The memory device 300 further includes frequency determination circuitry 310 configured to determine a frequency of the clock signal 308. The frequency determination circuitry 310 can include a local clock generator (e.g., an oscillator, an RC circuit, a tank circuit, or the like) configured to generate a local clock signal of a predetermined frequency. The frequency determination circuitry can further include comparison circuitry configured to compare the host clock signal 308 to the local clock signal to determine information about a frequency of the host clock signal (e.g., the frequency of the host clock signal, or an indication of whether the host clock signal has a higher or lower frequency than the local clock signal). The frequency determination circuitry 310 can provide the information about the frequency of the host clock signal to the memory array 302 to adjust one or more operating characteristics thereof.

Figure 4:
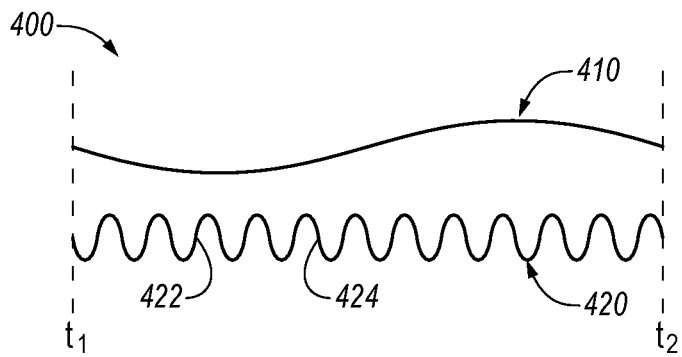
FIG. 4 illustrates a counting-based approach for determining a host clock frequency in accordance with an embodiment of the present technology.

FIG. 4 illustrates a counting-based approach for determining a host clock frequency in accordance with an embodiment of the present technology. As can be seen with reference to FIG. 4, a local clock signal 410 of a predetermined frequency can be used to time a counting window 400 during which the number of cycles of a host clock signal 420 can be counted (e.g., by detecting the rising edges 422 and/or falling edges 424 thereof). As the duration between times $t_1$ and $t_2$ is known, due to the predetermined frequency of the local clock signal 410, the frequency of the host clock signal 420 can be easily calculated by dividing the count of cycles of the host clock signal 420 by the duration between times $t_1$ and $t_2$.

Although in the embodiment illustrated in FIG. 4, a single cycle of local clock signal 410 is used to define the counting window 400, in other embodiments, a different number of cycles of the local clock signal 410 can be used. Increasing the duration of the counting window 400 can increase the accuracy of the determination of the frequency of the host clock signal 420, albeit at the cost of both a slower determination and potentially larger, more expensive and/or more space-consuming circuitry (e.g., to track a larger count it may be necessary to increase the number of bits used to store the count). Moreover, although in the embodiment illustrated in FIG. 4, the local clock signal 410 is illustrated as having a lower frequency than the host clock signal 420, in other embodiments a local clock signal 410 with a higher frequency than the host clock signal 420, or even the same frequency as the host clock signal 420, may be used.

Although in the foregoing embodiments, a determination of the frequency of a host clock signal has been described with reference to counting cycles of either the host clock or a locally generated reference signal, in other embodiments, other approaches to determining the frequency of a host clock signal can be used. For example, when a memory device is configured to be used at one of a discrete number of predetermined frequencies, the memory device can be configured to determine a host clock frequency by comparing (e.g., with a comparator) one or more locally generated clock signals to the host clock signal to determine whether one is faster/slower, or whether the signals are the same. In this regard, if a memory device is configured to operate at one of three predetermined host clock frequencies, x, y, or z, where x<y<z, a local clock at frequency y could be compared to the host clock signal (e.g., with a comparator) to determine whether the frequency of the host clock signal was less than, equal to, or greater than y. In other embodiments, in which it may be sufficient to optimize a memory device for either high- or low-frequency use, a similar comparison could be made between the host clock frequency and a locally generated clock to determine whether the host clock frequency was above or below the locally generated clock.

Figure 5:
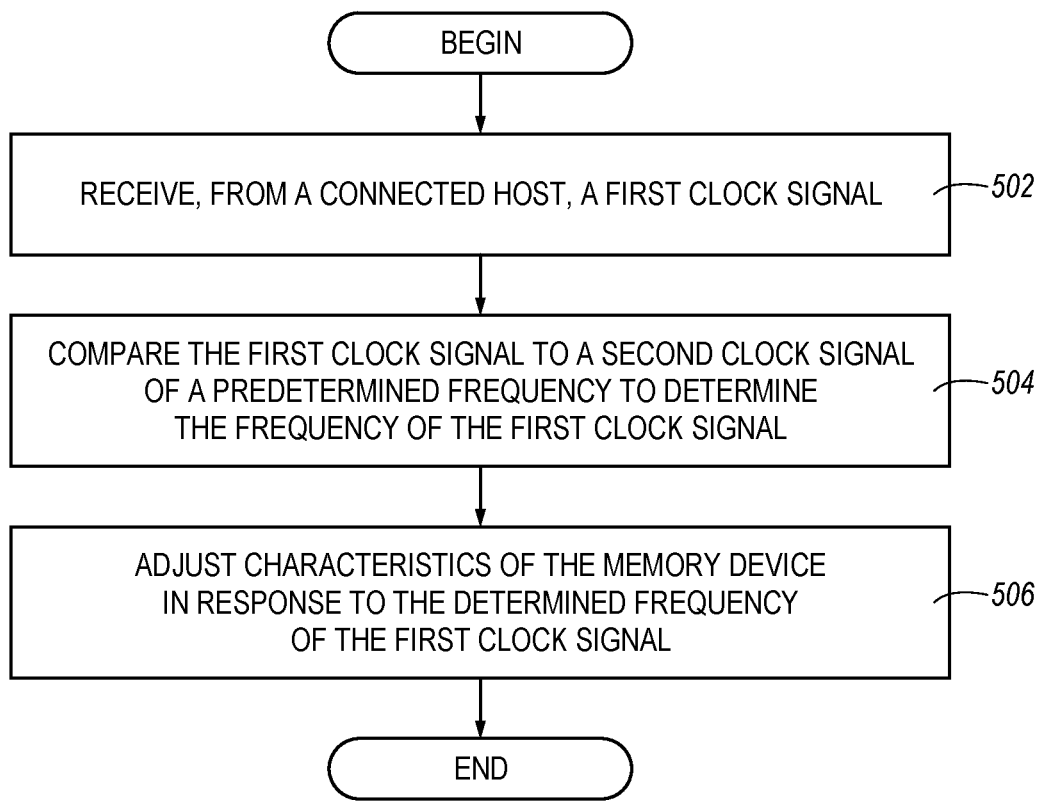
FIG. 5 is a flow chart illustrating a method for operating a memory device in accordance with an embodiment of the present technology.

FIG. 5 is a flow chart illustrating a method for operating a memory device in accordance with an embodiment of the present technology. The method includes receiving, from a connected host, a first reference clock signal (box 502), comparing the first reference clock signal to a second reference clock signal of a predetermined second frequency to determine a first frequency of the first reference clock signal (box 504), and adjusting one or more characteristics of the memory device in response to the determined first frequency of the first reference clock signal (box 506).

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A memory device comprising:
   one or more memories configured to receive a first reference clock signal from a connected host;
   circuitry configured to generate a second reference clock signal;
   circuitry configured to compare the first and second reference clock signals to determine the frequency of the first reference clock signal;
   circuitry configured to store the determined frequency; and
   circuitry configured to adjust one or more voltages of the memory device in response to the stored frequency of the first reference clock signal.

2. The memory device of claim 1, wherein the circuitry configured to compare the first and second reference clock signals includes:
   circuitry configured to count edges of the first reference clock signal over a predetermined number of cycles of the second reference clock signal.

3. The memory device of claim 1, wherein the one or more memories are DRAM memories.

4. The memory device of claim 1, wherein the memory device is a dual in-line memory module (DIMM).

5. The memory device of claim 1, wherein the one or more memories include at least one non-volatile memory.

6. The memory device of claim 1, wherein the memory device is a non-volatile dual in-line memory module (NVDIMM).

7. A memory module, comprising:
   a plurality of volatile memories configured to receive a first reference clock signal from a connected host;
   circuitry configured to generate a second reference clock signal;
   circuitry configured to compare the first and second reference clock signals to determine the frequency of the first reference clock signal;
   circuitry configured to store the determined frequency; and
   circuitry configured to adjust one or more voltages of the memory device in response to the stored frequency of the first reference clock signal.

8. The memory module of claim 7, wherein the circuitry configured to compare the first and second reference clock signals includes:
   circuitry configured to count edges of the first reference clock signal over a predetermined number of cycles of the second reference clock signal.

9. The memory module of claim 7, wherein the memory module is a dual in-line memory module (DIMM).

10. The memory module of claim 7, wherein the memory module is a non-volatile dual in-line memory module (NVDIMM).

11. A method of operating a memory device, comprising:
    receiving, from a connected host, a first reference clock signal;
    comparing the first reference clock signal to a second reference clock signal of a predetermined second frequency to determine a first frequency of the first reference clock signal;
    storing the determined frequency; and
    adjusting one or more voltages of the memory device in response to the stored first frequency of the first reference clock signal.

12. The method of claim 11, wherein the comparing the first reference clock signal to the second reference clock signal to includes:
    counting edges of the first reference clock signal over a predetermined number of cycles of the second reference clock signal.

13. The method of claim 11, wherein the memory device does not receive an indication of the frequency of the first reference clock signal from the connected host.

14. The memory device of claim 1, wherein the circuitry configured to store the determined frequency comprises one or more registers, tables, and/or pointers.

15. The memory module of claim 7, wherein the circuitry configured to store the determined frequency comprises one or more registers, tables, and/or pointers.

16. The method of claim 11, wherein storing the determined frequency comprises writing the determined frequency to one or more registers, tables, and/or pointers of the memory device.

* * * * *